United States Patent
Kim et al.

(10) Patent No.: US 9,858,972 B1
(45) Date of Patent: Jan. 2, 2018

(54) SEMICONDUCTOR DEVICES

(71) Applicant: SK hynix Inc., Icheon-si, Gyeonggi-do (KR)

(72) Inventors: Kyung Whan Kim, Seoul (KR); Dong Uk Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/597,672

(22) Filed: May 17, 2017

(30) Foreign Application Priority Data

Oct. 6, 2016 (KR) .................. 10-2016-0129366

(51) Int. Cl.
G11C 7/22 (2006.01)
G11C 7/10 (2006.01)
G06F 1/04 (2006.01)

(52) U.S. Cl.
CPC ............. *G11C 7/222* (2013.01); *G06F 1/04* (2013.01); *G11C 7/1012* (2013.01); *G11C 7/22* (2013.01)

(58) Field of Classification Search
CPC ......... G11C 7/222; G11C 7/22; G11C 7/1012; G06F 1/04
USPC ............... 365/189.05, 233.1, 233.11, 233.12
See application file for complete search history.

(56) References Cited

U.S. PATENT DOCUMENTS

| 6,160,426 | A | * | 12/2000 | Lee | ........................... | G06F 5/00 327/116 |
| 6,438,055 | B1 | * | 8/2002 | Taguchi | ................ | G11C 11/406 365/222 |
| 2013/0141994 | A1 | * | 6/2013 | Ito | ........................... | G11C 7/22 365/193 |
| 2013/0182516 | A1 | * | 7/2013 | Kinoshita | ........... | G11C 11/4076 365/194 |
| 2016/0004273 | A1 | | 1/2016 | Chiang et al. | | |

FOREIGN PATENT DOCUMENTS

KR 1020090063606 A 6/2009

* cited by examiner

*Primary Examiner* — Tan T. Nguyen
(74) *Attorney, Agent, or Firm* — William Park & Associates Ltd.

(57) ABSTRACT

A semiconductor device may be provided. The semiconductor device may include an input information signal generation circuit and a command generation circuit. The input information signal generation circuit may be configured to latch a command in synchronization with a point of time that a division clock signal is inputted. The command generation circuit may be configured to shift a phase of the latched command in synchronization with a multiplication clock signal to shift the command.

31 Claims, 16 Drawing Sheets

FIG. 6

| INPUT MOMENT OF COMMAND | LC<1> | LC<2> | LC<3> | LC<4> | MS | LS |
|---|---|---|---|---|---|---|
| ICLK<1> | H | L | L | L | L | L |
| ICLK<2> | L | H | L | L | L | H |
| ICLK<3> | L | L | H | L | H | L |
| ICLK<4> | L | L | L | H | H | H |

FIG. 13

| INPUT MOMENT OF COMMAND | LC<1> | LC<2> | LC<3> | LC<4> | LC<5> | LC<6> | LC<7> | LC<8> | MS | NS | LS |
|---|---|---|---|---|---|---|---|---|---|---|---|
| ICLK<1> | H | L | L | L | L | L | L | L | L | L | L |
| ICLK<2> | L | H | L | L | L | L | L | L | L | L | H |
| ICLK<3> | L | L | H | L | L | L | L | L | L | H | L |
| ICLK<4> | L | L | L | H | L | L | L | L | L | H | H |
| ICLK<5> | L | L | L | L | H | L | L | L | H | L | L |
| ICLK<6> | L | L | L | L | L | H | L | L | H | L | H |
| ICLK<7> | L | L | L | L | L | L | H | L | H | H | L |
| ICLK<8> | L | L | L | L | L | L | L | H | H | H | H |

SEMICONDUCTOR DEVICES

CROSS-REFERENCE TO RELATED APPLICATIONS

The present application claims priority under 35 U.S.C 119(a) to Korean Application No. 10-2016-0129366, filed on Oct. 6, 2016 which is herein incorporated by reference in its entirety.

BACKGROUND

1. Technical Field

Embodiments of the present disclosure may generally relate to semiconductor devices shifting a phase of a command with a multiplication clock signal.

2. Related Art

As semiconductor systems are developed to operate at a high speed, high data transmission rates (or data communication at high bandwidth) between semiconductor devices constituting each semiconductor system have been increasingly in demand. In response to such a demand, various circuit schemes have been proposed to obtain a high transmission rate or a high bandwidth of data that are serially inputted to or outputted from the semiconductor devices. Moreover, to obtain the parallel data, clock signals consisting of different phases, for example, multi-phase division clock signals are generated in the semiconductor devices and are used to input or output the data. A command for controlling operations of the semiconductor devices may be phase-shifted due to various latencies according to internal operations of the semiconductor devices.

SUMMARY

According to an embodiment, a semiconductor device may be provided. The semiconductor device may include an input information signal generation circuit and a command generation circuit. The input information signal generation circuit may be configured to latch a command in synchronization with a point of time that a division clock signal is inputted. The command generation circuit may be configured to shift a phase of the latched command in synchronization with a multiplication clock signal to shift the command.

BRIEF DESCRIPTION OF THE DRAWINGS

FIG. 6 is a table illustrating an operation of an input information signal generation circuit included in a semiconductor device according to an embodiment.

FIG. 13 is a table illustrating an operation of an input information signal generation circuit included in a semiconductor device according to an embodiment.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices shifting a phase of a command.

Figure 1:
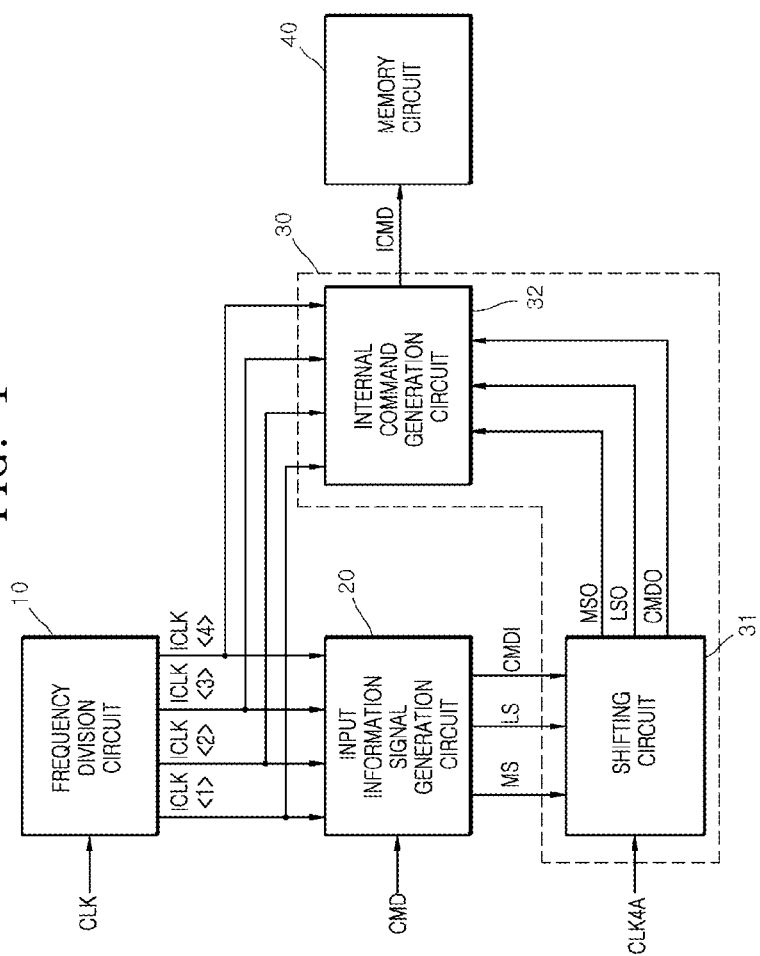
FIG. 1 is a block diagram illustrating a configuration of a semiconductor device according to an embodiment.

Referring to FIG. 1, a semiconductor device according to an embodiment may include a frequency division circuit 10, an input information signal generation circuit 20, a command generation circuit 30 and a memory circuit 40.

The frequency division circuit 10 may generate first to fourth division clock signals ICLK<1:4> in response to a clock signal CLK. The frequency division circuit 10 may divide a frequency of the clock signal CLK to generate the first to fourth division clock signals ICLK<1:4>. The frequency division circuit 10 may divide a frequency of the clock signal CLK to generate the first to fourth division clock signals ICLK<1:4> having different phases. The first to fourth division clock signals ICLK<1:4> may be generated to have, for example but not limited to, a phase difference of 90 degrees therebetween. The frequency division circuit 10 may also generate first to fourth multiplication clock signals (CLK4A, CLK4B, CLK4C and CLK4D of FIG. 2) having a low frequency which is one $(4N)^{th}$ a frequency of the clock signal CLK (wherein, the number "N" may be a natural number). That is, the first to fourth multiplication clock signals (CLK4A, CLK4B, CLK4C and CLK4D of FIG. 2) may be generated to have a cycle which is "4N" times greater than a cycle of the clock signal CLK.

The input information signal generation circuit 20 may generate a first input information signal MS and a second input information signal LS in response to a command CMD and in synchronization with the first to fourth division clock signals ICLK<1:4>. The input information signal generation circuit 20 may generate the first and second input information signals MS and LS having a certain combination (i.e., a logic level combination) according to an input moment of the command CMD in synchronization with the first to fourth division clock signals ICLK<1:4>. The input information signal generation circuit 20 may generate an input command CMDI which is enabled if the first and second input information signals MS and LS are generated. The input information signal generation circuit 20 may generate the input command CMDI which is enabled if the command CMD is inputted to the input information signal generation circuit 20.

The command CMD may be generated from a signal which is inputted to an external pin in synchronization with the clock signal CLK. The command CMD may be generated by decoding signals which are inputted to an external pin during a period that the clock signal CLK is toggled by a predetermined number of times. For example, the command CMD may be generated by decoding a signal inputted while the clock signal CLK is toggled firstly and a signal inputted while the clock signal CLK is toggled secondly. The command CMD may correspond to a signal for executing an internal operation such as a read operation or a write operation of the semiconductor device. A combination (i.e., a logic level combination) of the first and second input information signals MS and LS will be described later.

The command generation circuit 30 may include a shifting circuit 31 and an internal command generation circuit 32.

The shifting circuit 31 may shift phases of the first and second input information signals MS and LS to generate a first control signal MSO and a second control signal LSO, in synchronization with the first multiplication clock signal CLK4A. The shifting circuit 31 may shift a phase of the input command CMDI to generate a shifted command CMDO, in synchronization with the first multiplication clock signal CLK4A. An amount of phase that the first and second input information signals MS and LS are shifted in the shifting circuit 31 may be set to be different according to the embodiments. An amount of phase that the input command CMDI is shifted in the shifting circuit 31 may be set to be different according to the embodiments. A shifted phase of the first and second input information signals MS and LS may be set to be equal to a shifted phase of the input command CMDI.

The internal command generation circuit 32 may output the shifted command CMDO as an internal command ICMD according to a combination of the first and second control signals MSO and LSO, in synchronization with the first to fourth division clock signals ICLK<1:4>. The internal command generation circuit 32 may output the shifted command CMDO as the internal command ICMD according to a result that the first and second control signals MSO and LSO are decoded in synchronization with the first to fourth division clock signals ICLK<1:4>. A point of time that the internal command ICMD is outputted from the internal command generation circuit 32 may be controlled according to a combination of the first and second control signals MSO and LSO. The internal command generation circuit 32 may output the shifted command CMDO as the internal command ICMD according to points of time that the first to fourth division clock signals ICLK<1:4> are generated.

The command generation circuit 30 having an aforementioned configuration may shift the input command CMDI in synchronization with the first multiplication clock signal CLK4A to generate the shifted command CMDO and may output the shifted command CMDO as the internal command ICMD in synchronization with the first to fourth division clock signals ICLK<1:4>.

The memory circuit 40 may be realized to include a plurality of memory cells that store or output data in response to the internal command ICMD. The memory circuit 40 may be realized using a volatile memory circuit or a nonvolatile memory circuit for receiving or outputting the data.

Figure 2:
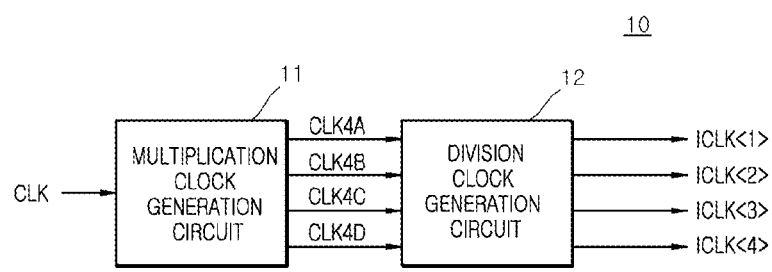
FIG. 2 is a block diagram illustrating a configuration of a frequency division circuit included in the semiconductor device of FIG. 1.

Referring to FIG. 2, the frequency division circuit 10 may include a multiplication clock generation circuit 11 and a division clock generation circuit 12.

The multiplication clock generation circuit 11 may generate the first to fourth multiplication clock signals CLK4A, CLK4B, CLK4C and CLK4D in response to the clock signal CLK. The multiplication clock generation circuit 11 may generate the first to fourth multiplication clock signals CLK4A, CLK4B, CLK4C and CLK4D having a low frequency which is one $(4N)^{th}$ a frequency of the clock signal CLK (wherein, the number "N" may be a natural number). The first to fourth multiplication clock signals CLK4A, CLK4B, CLK4C and CLK4D may be generated to have, for example, a phase difference of 90 degrees therebetween. The first to fourth multiplication clock signals CLK4A, CLK4B, CLK4C and CLK4D illustrated in FIG. 2 may be generated to have a low frequency which is one fourth a frequency of the clock signal CLK. A frequency of the first to fourth multiplication clock signals CLK4A, CLK4B, CLK4C and CLK4D may be set to be different according to the embodiments.

The division clock generation circuit 12 may generate the first to fourth division clock signals ICLK<1:4> which are sequentially created in synchronization with the first to fourth multiplication clock signals CLK4A, CLK4B, CLK4C and CLK4D. The first division clock signal ICLK<1> may include a pulse occurring in synchronization with a rising edge of the first multiplication clock signal CLK4A. The second division clock signal ICLK<2> may include a pulse occurring in synchronization with a rising edge of the second multiplication clock signal CLK4B. The third division clock signal ICLK<3> may include a pulse occurring in synchronization with a rising edge of the third multiplication clock signal CLK4C. The fourth division clock signal ICLK<4> may include a pulse occurring in synchronization with a rising edge of the fourth multiplication clock signal CLK4D.

Figure 3:
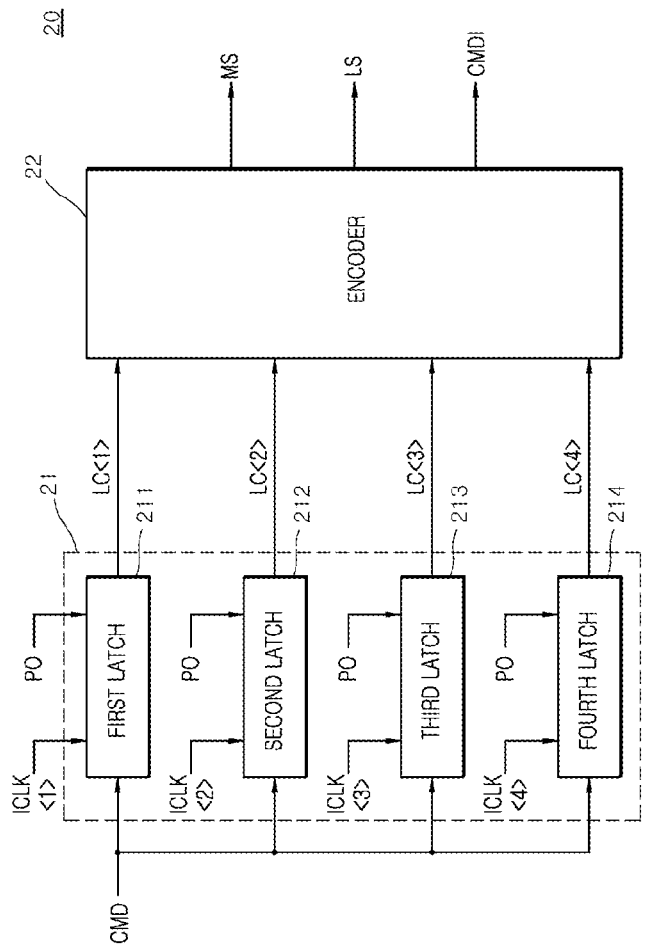
FIG. 3 is a block diagram illustrating a configuration of an input information signal generation circuit included in the semiconductor device of FIG. 1.

Referring to FIG. 3, the input information signal generation circuit 20 may include a latch circuit 21 and an encoder 22.

The latch circuit 21 may include a first latch 211, a second latch 212, a third latch 213 and a fourth latch 214.

The first latch 211 may latch the command CMD in synchronization with the first division clock signal ICLK<1>. The first latch 211 may output the latched command as a first latch command LC<1> in response to an output control signal PO. The first latch 211 may latch the command CMD to generate the first latch command LC<1>, at a point of time that a pulse of the first division clock signal ICLK<1> occurs.

The second latch 212 may latch the command CMD in synchronization with the second division clock signal ICLK<2>. The second latch 212 may output the latched command as a second latch command LC<2> in response to the output control signal PO. The second latch 212 may latch the command CMD to generate the second latch command LC<2>, at a point of time that a pulse of the second division clock signal ICLK<2> occurs.

The third latch 213 may latch the command CMD in synchronization with the third division clock signal ICLK<3>. The third latch 213 may output the latched command as a third latch command LC<3> in response to the output control signal PO. The third latch 213 may latch the command CMD to generate the third latch command LC<3>, at a point of time that a pulse of the third division clock signal ICLK<3> occurs.

The fourth latch 214 may latch the command CMD in synchronization with the fourth division clock signal ICLK<4>. The fourth latch 214 may output the latched command as a fourth latch command LC<4> in response to the output control signal PO. The fourth latch 214 may latch the command CMD to generate the fourth latch command LC<4>, at a point of time that a pulse of the fourth division clock signal ICLK<4> occurs.

The output control signal PO may be set to be a signal which is enabled after a pulse of the fourth division clock signal ICLK<4> occurs.

The encoder 22 may generate the first and second input information signals MS and LS according to a combination of the first to fourth latch commands LC<1:4>. The encoder 22 may generate the input command CMDI which is enabled if the first to fourth latch commands LC<1:4> are inputted. The encoder 22 may generate the input command CMDI which is enabled if any one of the first to fourth latch commands LC<1:4> is enabled. A combination of the first and second input information signals MS and LS which are generated according to a combination of the first to fourth latch commands LC<1:4> will be described later.

Figure 4:
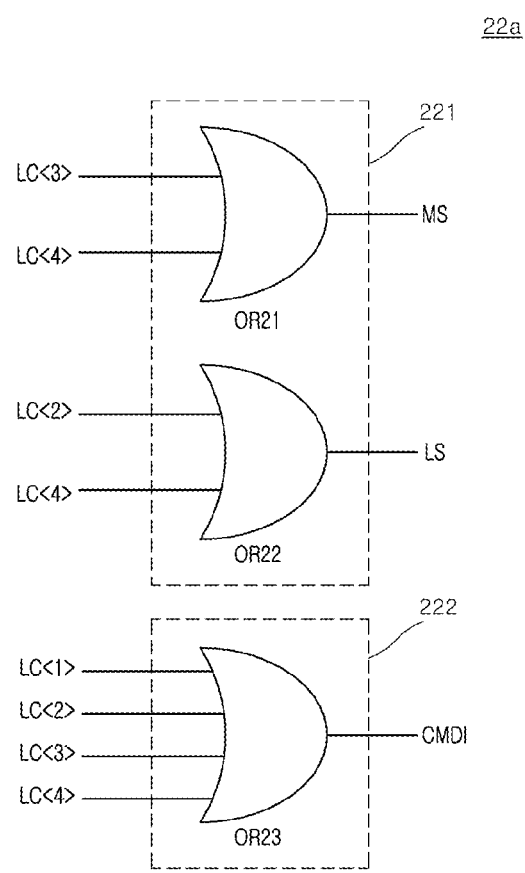
FIG. 4 is a circuit diagram illustrating an example of an encoder included in the input information signal generation circuit of FIG. 3.

Referring to FIG. 4, an encoder 22a corresponding to an example of the encoder 22 illustrated in FIG. 3 may include a first logic circuit 221 and a second logic circuit 222.

The first logic circuit 221 may be realized using, for example but not limited to, OR gates OR21 and OR22.

The OR gate OR21 may generate the first input information signal MS which is enabled to have a logic "high" level if any one of the third and fourth latch commands LC<3:4> is enabled to have a logic "high" level. The OR gate OR21 may execute a logical OR operation of the third and fourth latch commands LC<3:4> to generate the first input information signal MS.

The OR gate OR22 may generate the second input information signal LS which is enabled to have a logic "high" level if any one of the second latch command LC<2> and the fourth latch command LC<4> is enabled to have a logic "high" level. The OR gate OR22 may execute a logical OR operation of the second latch command LC<2> and the fourth latch command LC<4> to generate the second input information signal LS.

The second logic circuit 222 may be realized using, for example but not limited to, an OR gate OR23.

The OR gate OR23 may generate the input command CMDI which is enabled to have a logic "high" level if any one of the first to fourth latch commands LC<1:4> is enabled to have a logic "high" level. The OR gate OR23 may execute a logical OR operation of the first to fourth latch commands LC<1:4> to generate the input command CMDI.

Figure 5:
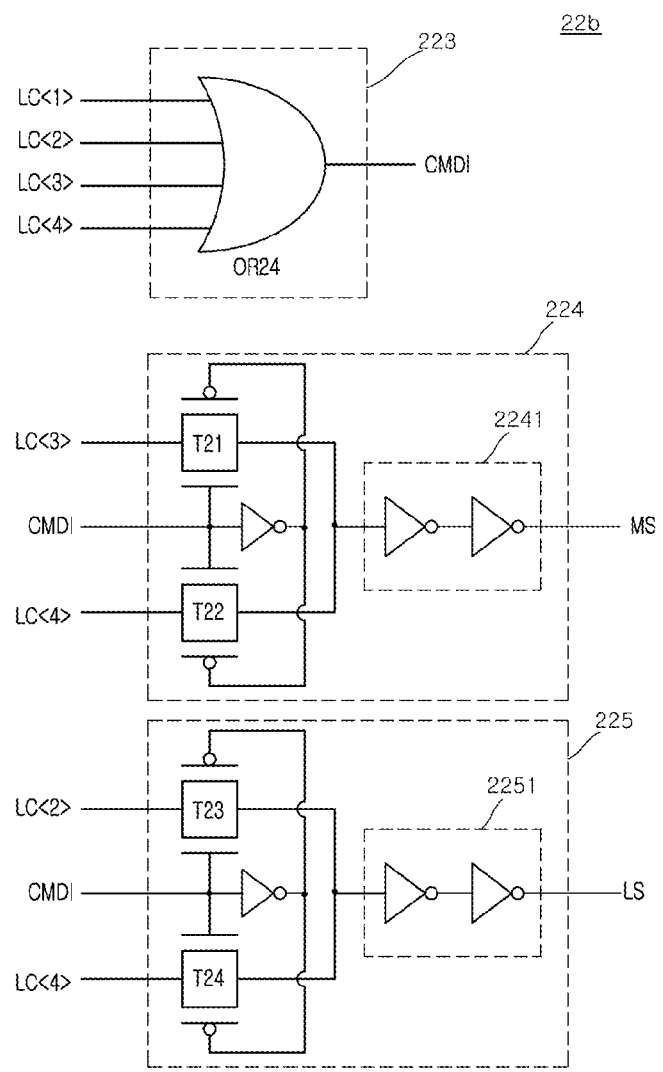
FIG. 5 is a circuit diagram illustrating another example of an encoder included in the input information signal generation circuit of FIG. 3.

Referring to FIG. 5, an encoder 22b corresponding to another example of the encoder 22 illustrated in FIG. 3 may include a third logic circuit 223, a first transmission circuit 224 and a second transmission circuit 225.

The third logic circuit 223 may be realized using, for example but not limited to, an OR gate OR24.

The OR gate OR24 may generate the input command CMDI which is enabled to have a logic "high" level if any one of the first to fourth latch commands LC<1:4> is enabled to have a logic "high" level. The OR gate OR24 may execute a logical OR operation of the first to fourth latch commands LC<1:4> to generate the input command CMDI.

The first transmission circuit 224 may be realized to include transfer gates T21 and T22 and a buffer 2241. The first transmission circuit 224 may generate the first input information signal MS which is enabled if any one of the third and fourth latch commands LC<3:4> is enabled in response to the input command CMDI. The first transmission circuit 224 may generate the first input information signal MS which is enabled to have a logic "high" level if the input command CMDI is enabled to have a logic "high" level and any one of the third and fourth latch commands LC<3:4> is enabled to have a logic "high" level.

The second transmission circuit 225 may be realized to include transfer gates T23 and T24 and a buffer 2251. The second transmission circuit 225 may generate the second input information signal LS which is enabled if any one of the second latch command LC<2> and the fourth latch command LC<4> is enabled in response to the input command CMDI. The second transmission circuit 225 may generate the second input information signal LS which is enabled to have a logic "high" level if the input command CMDI is enabled to have a logic "high" level and any one of the second latch command LC<2> and the fourth latch command LC<4> is enabled to have a logic "high" level.

An operation of the input information signal generation circuit 20 will be described more fully hereinafter with reference to FIG. 6 together with various combinations of the first to fourth latch commands LC<1:4> and the first and second input information signals MS and LS, which are set according to the points of time that the command CMD is inputted.

If the command CMD is inputted at a point of time that a pulse of the first division clock signal ICLK<1> occurs, the first latch command LC<1> may be generated to have a logic "high (H)" level and the second to fourth latch commands LC<2:4> may be generated to have a logic "low (L)" level. In such a case, both of the first and second input information signals MS and LS may be generated to have a logic "low (L)" level according to a combination of the first to fourth latch commands LC<1:4>.

If the command CMD is inputted at a point of time that a pulse of the second division clock signal ICLK<2> occurs, the first, third and fourth latch commands LC<1>, LC<3> and LC<4> may be generated to have a logic "low (L)" level and the second latch command LC<2> may be generated to have a logic "high (H)" level. In such a case, the first and second input information signals MS and LS may be respectively generated to have a logic "low (L)" level and a logic "high (H)" level according to a combination of the first to fourth latch commands LC<1:4>.

If the command CMD is inputted at a point of time that a pulse of the third division clock signal ICLK<3> occurs, the first, second and fourth latch commands LC<1>, LC<2> and LC<4> may be generated to have a logic "low (L)" level and the third latch command LC<3> may be generated to have a logic "high (H)" level. In such a case, the first and second input information signals MS and LS may be respectively generated to have a logic "high (H)" level and a logic "low (L)" level according to a combination of the first to fourth latch commands LC<1:4>.

If the command CMD is inputted at a point of time that a pulse of the fourth division clock signal ICLK<4> occurs, the first to third latch commands LC<1:3> may be generated to have a logic "low (L)" level and the fourth latch command LC<4> may be generated to have a logic "high (H)" level. In such a case, both of the first and second input information signals MS and LS may be generated to have a logic "high (H)" level according to a combination of the first to fourth latch commands LC<1:4>.

Figure 7:
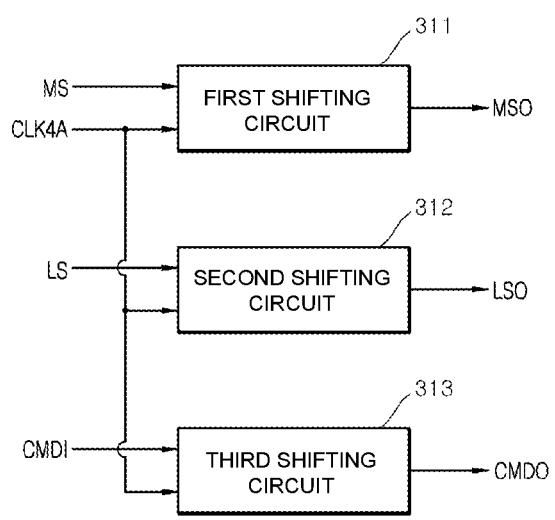
FIG. 7 is a block diagram illustrating a configuration of a shifting circuit included in the semiconductor device of FIG. 1.

Referring to FIG. 7, the shifting circuit 31 may include a first shifting circuit 311, a second shifting circuit 312 and a third shifting circuit 313.

The first shifting circuit 311 may shift a phase of the first input information signal MS to generate the first control signal MSO, in synchronization with the first multiplication clock signal CLK4A. The first shifting circuit 311 may be realized using a plurality of registers and may delay the first input information signal MS according to a frequency of the first multiplication clock signal CLK4A to generate the first control signal MSO.

The second shifting circuit 312 may shift a phase of the second input information signal MS to generate the second control signal LSO, in synchronization with the first multiplication clock signal CLK4A. The second shifting circuit 312 may be realized using a plurality of registers and may delay the second input information signal LS according to a frequency of the first multiplication clock signal CLK4A to generate the second control signal LSO.

The third shifting circuit 313 may shift a phase of the input command CMDI to generate the shifted command CMDO, in synchronization with the first multiplication clock signal CLK4A. The third shifting circuit 313 may be realized using a plurality of registers and may delay the input command CMDI according to a frequency of the first multiplication clock signal CLK4A to generate the shifted command CMDO.

The first to third shifting circuits 311, 312 and 313 may be designed to have the same delay time. The delay time of the first to third shifting circuits 311, 312 and 313 may be set to be different according to a latency of the semiconductor device.

Figure 8:
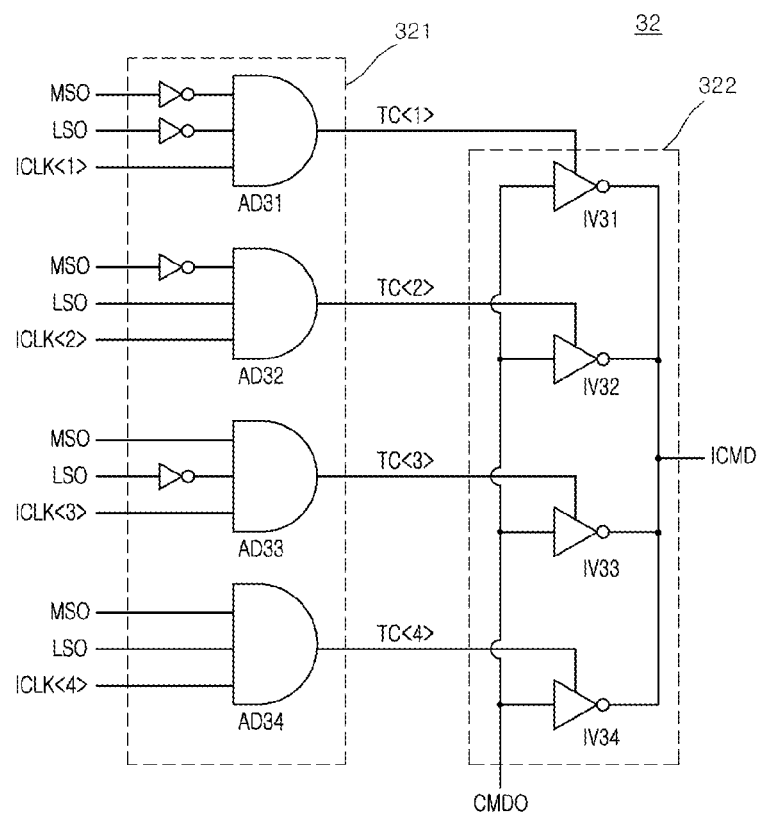
FIG. 8 is a circuit diagram illustrating an internal command generation circuit included in the semiconductor device of FIG. 1.

Referring to FIG. 8, the internal command generation circuit 32 may include a transmission command generation circuit 321 and an internal command output circuit 322.

The transmission command generation circuit 321 may include, for example but not limited to, logic gates for performing AND operations. For example, the transmission command generation circuit 321 may include for example but not limited to AND gates AD31, AD32, AD33 and AD34.

The AND gate AD31 may generate a first transmission command TC<1> which is enabled if the first and second control signals MSO and LSO have a predetermined combination in synchronization with the first division clock signal ICLK<1>. The AND gate AD31 may generate the first transmission command TC<1> which is enabled to have a logic "high" level at a point of time that a pulse of the first division clock signal ICLK<1> is inputted if both of the first and second control signals MSO and LSO have a logic "low" level.

The AND gate AD32 may generate a second transmission command TC<2> which is enabled if the first and second control signals MSO and LSO have a predetermined combination in synchronization with the second division clock signal ICLK<2>. The AND gate AD32 may generate the second transmission command TC<2> which is enabled to have a logic "high" level at a point of time that a pulse of the second division clock signal ICLK<2> is inputted if the first control signal MSO has a logic "low" level and the second control signal LSO has a logic "high" level.

The AND gate AD33 may generate a third transmission command TC<3> which is enabled if the first and second control signals MSO and LSO have a predetermined combination in synchronization with the third division clock signal ICLK<3>. The AND gate AD33 may generate the third transmission command TC<3> which is enabled to have a logic "high" level at a point of time that a pulse of the third division clock signal ICLK<3> is inputted if the first control signal MSO has a logic "high" level and the second control signal LSO has a logic "low" level.

The AND gate AD34 may generate a fourth transmission command TC<4> which is enabled if the first and second control signals MSO and LSO have a predetermined combination in synchronization with the fourth division clock signal ICLK<4>. The AND gate AD34 may generate the fourth transmission command TC<4> which is enabled to have a logic "high" level at a point of time that a pulse of the fourth division clock signal ICLK<4> is inputted if both of the first and second control signals MSO and LSO have a logic "high" level.

The internal command output circuit 322 may include inverters IV31, IV32, IV33 and IV34.

The inverter IV31 may inversely buffer the shifted command CMDO to output the inversely buffered signal as the internal command ICMD, in response to the first transmission command TC<1>. The inverter IV31 may inversely buffer the shifted command CMDO to output the inversely buffered signal as the internal command ICMD if the first transmission command TC<1> is enabled to have a logic "high" level.

The inverter IV32 may inversely buffer the shifted command CMDO to output the inversely buffered signal as the internal command ICMD, in response to the second transmission command TC<2>. The inverter IV32 may inversely buffer the shifted command CMDO to output the inversely buffered signal as the internal command ICMD if the second transmission command TC<2> is enabled to have a logic "high" level.

The inverter IV33 may inversely buffer the shifted command CMDO to output the inversely buffered signal as the internal command ICMD, in response to the third transmission command TC<3>. The inverter IV33 may inversely buffer the shifted command CMDO to output the inversely buffered signal as the internal command ICMD if the third transmission command TC<3> is enabled to have a logic "high" level.

The inverter IV34 may inversely buffer the shifted command CMDO to output the inversely buffered signal as the internal command ICMD, in response to the fourth transmission command TC<4>. The inverter IV34 may inversely buffer the shifted command CMDO to output the inversely buffered signal as the internal command ICMD if the fourth transmission command TC<4> is enabled to have a logic "high" level.

Figure 9:
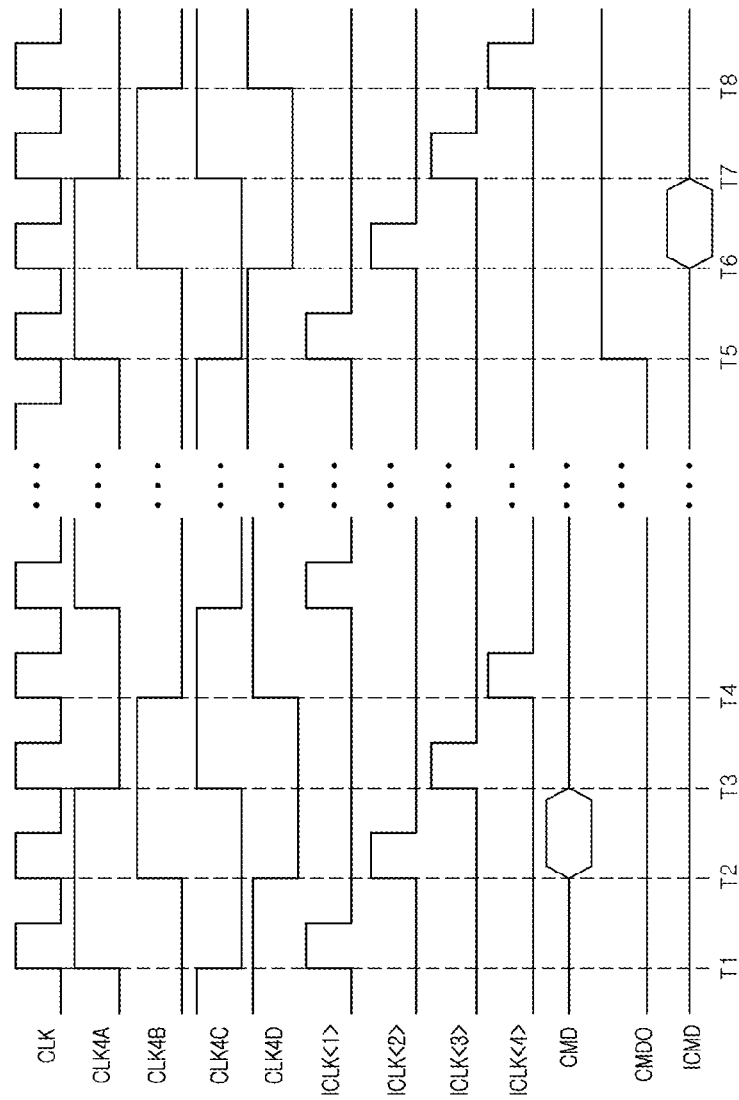
FIG. 9 is a timing diagram illustrating an operation of a semiconductor device according to an embodiment.

An operation of the semiconductor device having an aforementioned configuration will be described hereinafter with reference to FIG. 9 in conjunction with an example in which the command CMD is inputted at a point of time that a pulse of the second division clock signal ICLK<2> occurs.

At a point of time "T1, the multiplication clock generation circuit 11 may generate the first multiplication clock signal CLK4A having a logic "high" level in response to the clock signal CLK. The first multiplication clock signal CLK4A may be generated to have a low frequency which is one fourth a frequency of the clock signal CLK. The division clock generation circuit 12 may generate a pulse of the first division clock signal ICLK<1> in synchronization with a rising edge of the first multiplication clock signal CLK4A.

At a point of time "T2", the multiplication clock generation circuit 11 may generate the second multiplication clock signal CLK4B having a logic "high" level in response to the clock signal CLK. The second multiplication clock signal CLK4B may be generated to have a low frequency which is one fourth a frequency of the clock signal CLK. The division clock generation circuit 12 may generate a pulse of the second division clock signal ICLK<2> in synchronization with a rising edge of the second multiplication clock signal CLK4B.

At a point of time "T3", the multiplication clock generation circuit 11 may generate the third multiplication clock signal CLK4C having a logic "high" level in response to the clock signal CLK. The third multiplication clock signal CLK4C may be generated to have a low frequency which is one fourth a frequency of the clock signal CLK. The division clock generation circuit 12 may generate a pulse of the third division clock signal ICLK<3> in synchronization with a rising edge of the third multiplication clock signal CLK4C.

At a point of time "T4", the multiplication clock generation circuit 11 may generate the fourth multiplication clock signal CLK4D having a logic "high" level in response to the clock signal CLK. The fourth multiplication clock signal CLK4D may be generated to have a low frequency which is one fourth a frequency of the clock signal CLK. The division clock generation circuit 12 may generate a pulse of the fourth division clock signal ICLK<4> in synchronization with a rising edge of the fourth multiplication clock signal CLK4D.

Since the command CMD is inputted at the point of time "T2" corresponding to a point of time that the pulse of the second division clock signal ICLK<2> occurs, the first, third and fourth latch commands LC<1>, LC<3> and LC<4> may be generated to have a logic "low" level and the second latch command LC<2> may be generated to have a logic "high" level. Thus, the first and second input information signals MS and LS may be respectively generated to have a logic "low" level and a logic "high" level according to a combination of the first to fourth latch commands LC<1:4>.

At a point of time "T5", the shifting circuit 31 may shift the phases of the first and second input information signals MS and LS of the point of time "T4" in synchronization with the first multiplication clock signal CLK4A, thereby generating the first control signal MSO having a logic "low" level and the second control signal LSO having a logic "high" level. The shifting circuit 31 may shift a phase of the input command CMDI in synchronization with the first multiplication clock signal CLK4A to generate the shifted command CMDO having a logic "high" level.

The multiplication clock generation circuit 11 may generate the first multiplication clock signal CLK4A having a logic "high" level in response to the clock signal CLK. The first multiplication clock signal CLK4A may be generated to have a low frequency which is one fourth a frequency of the clock signal CLK. The division clock generation circuit 12 may generate a pulse of the first division clock signal ICLK<1> in synchronization with a rising edge of the first multiplication clock signal CLK4A.

At a point of time "T6", the multiplication clock generation circuit 11 may generate the second multiplication clock signal CLK4B having a logic "high" level in response to the clock signal CLK. The second multiplication clock signal CLK4B may be generated to have a low frequency which is one fourth a frequency of the clock signal CLK. The division clock generation circuit 12 may generate a pulse of the second division clock signal ICLK<2> in synchronization with a rising edge of the second multiplication clock signal CLK4B.

At a point of time "T7", the multiplication clock generation circuit 11 may generate the third multiplication clock signal CLK4C having a logic "high" level in response to the clock signal CLK. The third multiplication clock signal CLK4C may be generated to have a low frequency which is one fourth a frequency of the clock signal CLK. The division clock generation circuit 12 may generate a pulse of the third division clock signal ICLK<3> in synchronization with a rising edge of the third multiplication clock signal CLK4C.

At a point of time "T8", the multiplication clock generation circuit 11 may generate the fourth multiplication clock signal CLK4D having a logic "high" level in response to the clock signal CLK. The fourth multiplication clock signal CLK4D may be generated to have a low frequency which is one fourth a frequency of the clock signal CLK. The division clock generation circuit 12 may generate a pulse of the fourth division clock signal ICLK<4> in synchronization with a rising edge of the fourth multiplication clock signal CLK4D.

At the point of time "T6", the internal command generation circuit 32 may output the shifted command CMDO as the internal command ICMD in synchronization with the second division clock signal ICLK<2> because the first control signal MSO has a logic "low" level and the second control signal LSO has a logic "high" level.

As described above, a semiconductor device according to an embodiment may latch a command in synchronization with a point of time that a division clock signal is inputted and may shift a phase of the latched command in synchronization with a multiplication clock signal to reduce the number of registers for shifting the command.

Figure 10:
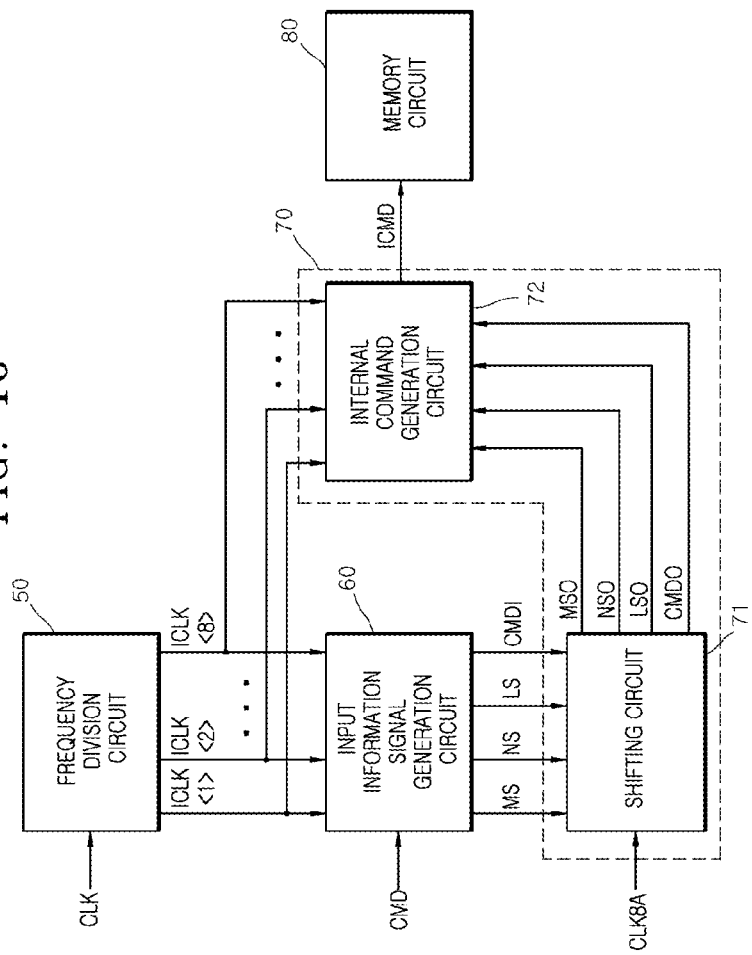
FIG. 10 is a block diagram illustrating a configuration of a semiconductor device according to an embodiment.

Referring to FIG. 10, a semiconductor device according to other embodiments may include a frequency division circuit 50, an input information signal generation circuit 60, a command generation circuit 70 and a memory circuit 80.

The frequency division circuit 50 may generate first to eighth division clock signals ICLK<1:8> in response to a clock signal CLK. The frequency division circuit 50 may divide a frequency of the clock signal CLK to generate the first to eighth division clock signals ICLK<1:8>. The frequency division circuit 50 may divide a frequency of the clock signal CLK to generate the first to eighth division clock signals ICLK<1:8> having different phases. The first to eighth division clock signals ICLK<1:8> may be generated to have a phase difference of, for example but not limited to, 45 degrees therebetween. The frequency division circuit 50 may also generate first to eighth multiplication clock signals (CLK8A, CLK8B, CLK8C, CLK8D, CLK8E, CLK8F, CLK8G and CLK8H of FIG. 11) having a low frequency which is one $(8N)^{th}$ a frequency of the clock signal CLK (wherein, the number "N" may be a natural number). For example, the first to eighth multiplication clock signals (CLK8A, CLK8B, CLK8C, CLK8D, CLK8E, CLK8F, CLK8G and CLK8H of FIG. 11) may be generated to have a cycle which is "8N" times greater than a cycle of the clock signal CLK. In some embodiments, the frequency division circuit 50 may generate first to sixteenth multiplication clock signals (not illustrated) having a low frequency which is one $(16N)^{th}$ a frequency of the clock signal CLK (wherein, the number "N" may be a natural number). For example, the first to sixteenth multiplication clock signals (not illustrated) may be generated to have a cycle which is "16N" times greater than a cycle of the clock signal CLK.

In some embodiments, the frequency division circuit 50 may generate first to Mth multiplication clock signals (not illustrated) having a low frequency which is one $(MN)^{th}$ a frequency of the clock signal CLK (wherein, the numbers "M" and "N" may be natural numbers).

The input information signal generation circuit 60 may generate a first input information signal MS, a second input information signal NS and a third input information signal LS in response to a command CMD and in synchronization with the first to eighth division clock signals ICLK<1:8>. The input information signal generation circuit 60 may generate the first to third input information signals MS, NS and LS having a certain combination (i.e., a logic level combination) according to an input moment of the command CMD in synchronization with the first to eighth division clock signals ICLK<1:8>. The input information signal generation circuit 60 may generate an input command CMDI which is enabled if the first to third input information signals MS, NS and LS are generated. The input information signal generation circuit 60 may generate the input command CMDI which is enabled if the command CMD is inputted to the input information signal generation circuit 60. A combination (i.e., a logic level combination) of the first to third input information signals MS, NS and LS will be described later.

The command generation circuit 70 may include a shifting circuit 71 and an internal command generation circuit 72.

The shifting circuit 71 may shift phases of the first to third input information signals MS, NS and LS to generate a first control signal MSO, a second control signal NSO and a third control signal LSO, in synchronization with the first multiplication clock signal CLK8A. The shifting circuit 71 may shift a phase of the input command CMDI to generate a shifted command CMDO, in synchronization with the first multiplication clock signal CLK8A. An amount of phase that the first to third input information signals MS, NS and LS are shifted in the shifting circuit 71 may be set to be different according to the embodiments. An amount of phase that the input command CMDI is shifted in the shifting circuit 71 may be set to be different according to the embodiments. A shifted phase of the first to third input information signals MS, NS and LS may be set to be equal to a shifted phase of the input command CMDI.

The internal command generation circuit 72 may output the shifted command CMDO as an internal command ICMD according to a combination of the first to third control signals MSO, NSO and LSO, in synchronization with the first to eighth division clock signals ICLK<1:8>. A point of time that the internal command ICMD is outputted from the internal command generation circuit 72 may be controlled according to a combination of the first to third control signals MSO, NSO and LSO.

The command generation circuit 70 having an aforementioned configuration may shift the input command CMDI in synchronization with the first multiplication clock signal CLK8A to generate the shifted command CMDO and may output the shifted command CMDO as the internal command ICMD in synchronization with the first to eighth division clock signals ICLK<1:8>.

The memory circuit 80 may be realized to include a plurality of memory cells that store or output data in response to the internal command ICMD. The memory circuit 80 may be realized using a volatile memory circuit or a nonvolatile memory circuit for receiving or outputting the data.

Figure 11:
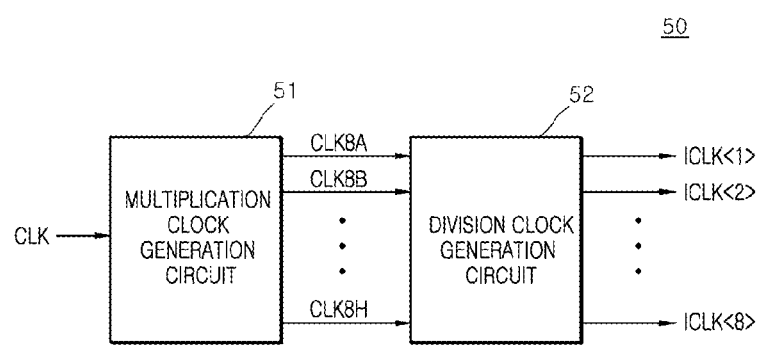
FIG. 11 is a block diagram illustrating a configuration of a frequency division circuit included in the semiconductor device of FIG. 10.

Referring to FIG. 11, the frequency division circuit 50 may include a multiplication clock generation circuit 51 and a division clock generation circuit 52.

The multiplication clock generation circuit 51 may generate the first to eighth multiplication clock signals CLK8A, CLK8B, CLK8C, CLK8D, CLK8E, CLK8F, CLK8G and CLK8H in response to the clock signal CLK. The multiplication clock generation circuit 51 may generate the first to eighth multiplication clock signals CLK8A, CLK8B, CLK8C, CLK8D, CLK8E, CLK8F, CLK8G and CLK8H having a low frequency which is one $(8N)^{th}$ a frequency of the clock signal CLK (wherein, the number "N" may be a natural number). The first to eighth multiplication clock signals CLK8A, CLK8B, CLK8C, CLK8D, CLK8E, CLK8F, CLK8G and CLK8H may be generated to have a phase difference of 45 degrees therebetween. The first to eighth multiplication clock signals CLK8A, CLK8B, CLK8C, CLK8D, CLK8E, CLK8F, CLK8G and CLK8H illustrated in FIG. 11 may be generated to have a low frequency which is one eighth a frequency of the clock signal CLK. A frequency of the first to eighth multiplication clock signals CLK8A, CLK8B, CLK8C, CLK8D, CLK8E, CLK8F, CLK8G and CLK8H may be set to be different according to the embodiments.

The division clock generation circuit 52 may generate the first to eighth division clock signals ICLK<1:8> which are sequentially created in synchronization with the first to eighth multiplication clock signals CLK8A, CLK8B, CLK8C, CLK8D, CLK8E, CLK8F, CLK8G and CLK8H. The first division clock signal ICLK<1> may include a pulse occurring in synchronization with a rising edge of the first multiplication clock signal CLK8A. The second division clock signal ICLK<2> may include a pulse occurring in synchronization with a rising edge of the second multiplication clock signal CLK8B. The third division clock signal ICLK<3> may include a pulse occurring in synchronization with a rising edge of the third multiplication clock signal CLK8C. The fourth division clock signal ICLK<4> may include a pulse occurring in synchronization with a rising edge of the fourth multiplication clock signal CLK8D. The fifth division clock signal ICLK<5> may include a pulse occurring in synchronization with a rising edge of the fifth multiplication clock signal CLK8E. The sixth division clock signal ICLK<6> may include a pulse occurring in synchronization with a rising edge of the sixth multiplication clock signal CLK8F. The seventh division clock signal ICLK<7> may include a pulse occurring in synchronization with a rising edge of the seventh multiplication clock signal CLK8G. The eighth division clock signal ICLK<8> may include a pulse occurring in synchronization with a rising edge of the eighth multiplication clock signal CLK8H.

Figure 12:
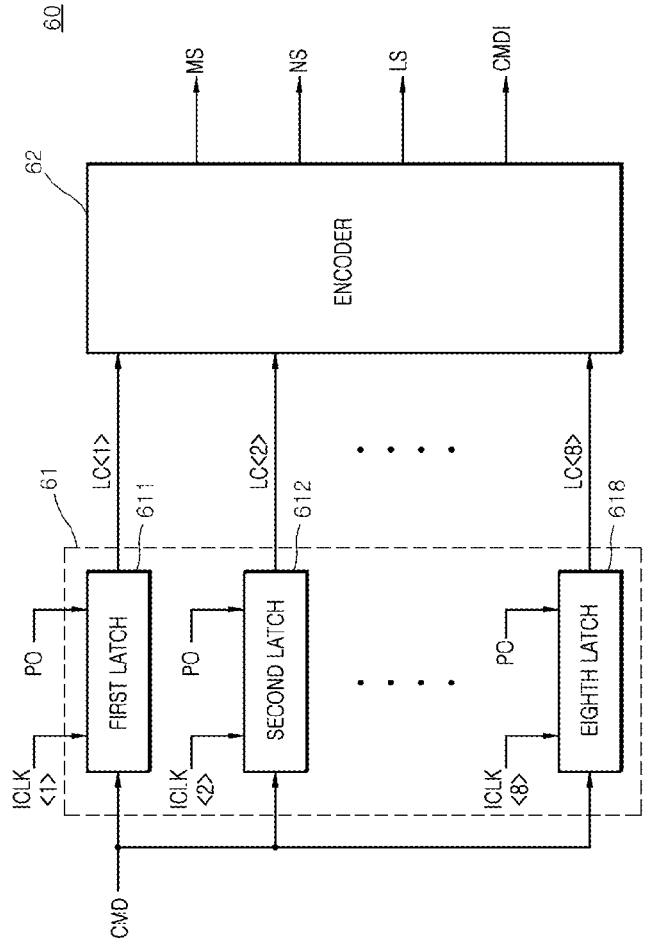
FIG. 12 is a block diagram illustrating a configuration of an input information signal generation circuit included in the semiconductor device of FIG. 10.

Referring to FIG. 12, the input information signal generation circuit 60 may include a latch circuit 61 and an encoder 62.

The latch circuit 61 may include first to eighth latches 611, 612, 613, 614, 615, 616, 617 and 618.

The first latch 611 may latch the command CMD in synchronization with the first division clock signal ICLK<1>. The first latch 611 may output the latched command as a first latch command LC<1> in response to an output control signal PO. The first latch 611 may latch the command CMD to generate the first latch command LC<1>, at a point of time that a pulse of the first division clock signal ICLK<1> occurs.

The second latch 612 may latch the command CMD in synchronization with the second division clock signal ICLK<2>. The second latch 612 may output the latched command as a second latch command LC<2> in response to the output control signal PO. The second latch 612 may latch the command CMD to generate the second latch command LC<2>, at a point of time that a pulse of the second division clock signal ICLK<2> occurs.

The third latch 613 (not illustrated) may latch the command CMD in synchronization with the third division clock signal ICLK<3>. The third latch 613 may output the latched command as a third latch command LC<3> in response to the output control signal PO. The third latch 613 may latch the command CMD to generate the third latch command LC<3>, at a point of time that a pulse of the third division clock signal ICLK<3> occurs.

The fourth latch 614 (not illustrated) may latch the command CMD in synchronization with the fourth division clock signal ICLK<4>. The fourth latch 614 may output the latched command as a fourth latch command LC<4> in response to the output control signal PO. The fourth latch 614 may latch the command CMD to generate the fourth latch command LC<4>, at a point of time that a pulse of the fourth division clock signal ICLK<4> occurs.

The fifth latch 615 (not illustrated) may latch the command CMD in synchronization with the fifth division clock signal ICLK<5>. The fifth latch 615 may output the latched command as a fifth latch command LC<5> in response to the output control signal PO. The fifth latch 615 may latch the command CMD to generate the fifth latch command LC<5>, at a point of time that a pulse of the fifth division clock signal ICLK<5> occurs.

The sixth latch 616 (not illustrated) may latch the command CMD in synchronization with the sixth division clock signal ICLK<6>. The sixth latch 616 may output the latched command as a sixth latch command LC<6> in response to the output control signal PO. The sixth latch 616 may latch the command CMD to generate the sixth latch command LC<6>, at a point of time that a pulse of the sixth division clock signal ICLK<6> occurs.

The seventh latch 617 (not illustrated) may latch the command CMD in synchronization with the seventh division clock signal ICLK<7>. The seventh latch 617 may output the latched command as a seventh latch command LC<7> in response to the output control signal PO. The seventh latch 617 may latch the command CMD to generate the seventh latch command LC<7>, at a point of time that a pulse of the seventh division clock signal ICLK<7> occurs.

The eighth latch 618 may latch the command CMD in synchronization with the eighth division clock signal ICLK<8>. The eighth latch 618 may output the latched command as an eighth latch command LC<8> in response to the output control signal PO. The eighth latch 618 may latch the command CMD to generate the eighth latch command LC<8>, at a point of time that a pulse of the eighth division clock signal ICLK<8> occurs.

The output control signal PO may be set to be a signal which is enabled after a pulse of the eighth division clock signal ICLK<8> occurs.

The encoder 62 may generate the first to third input information signals MS, NS and LS according to a combination of the first to eighth latch commands LC<1:8>. The encoder 62 may generate the input command CMDI which is enabled if the first to eighth latch commands LC<1:8> are inputted. The encoder 62 may generate the input command CMDI which is enabled if any one of the first to eighth latch commands LC<1:8> is enabled. A combination of the first to third input information signals MS, NS and LS which are generated according to a combination of the first to eighth latch commands LC<1:8> will be described later.

An operation of the input information signal generation circuit 60 will be described hereinafter with reference to FIG. 13 together with various combinations of the first to eighth latch commands LC<1:8> and the first to third input information signals MS, NS and LS, which are set according to the points of time that the command CMD is inputted.

If the command CMD is inputted at a point of time that a pulse of the first division clock signal ICLK<1> occurs, the first latch command LC<1> may be generated to have a logic "high (H)" level and the second to eighth latch commands LC<2:8> may be generated to have a logic "low (L)" level. In such a case, all of the first to third input information signals MS, NS and LS may be generated to have a logic "low (L)" level according to a combination of the first to eighth latch commands LC<1:8>.

If the command CMD is inputted at a point of time that a pulse of the second division clock signal ICLK<2> occurs, the first and third to eighth latch commands LC<1> and LC<3>~LC<8> may be generated to have a logic "low (L)" level and the second latch command LC<2> may be generated to have a logic "high (H)" level. In such a case, the first and second input information signals MS and NS may be generated to have a logic "low (L)" level and the third input information signal LS may be generated to have a logic "high (H)" level, according to a combination of the first to eighth latch commands LC<1:8>.

If the command CMD is inputted at a point of time that a pulse of the third division clock signal ICLK<3> occurs, the first, second and fourth to eighth latch commands LC<1>, LC<2> and LC<4>~LC<8> may be generated to have a logic "low (L)" level and the third latch command LC<3> may be generated to have a logic "high (H)" level. In such a case, the first and third input information signals MS and LS may be generated to have a logic "low (L)" level and the second input information signal NS may be generated to have a logic "high (H)" level, according to a combination of the first to eighth latch commands LC<1:8>.

If the command CMD is inputted at a point of time that a pulse of the fourth division clock signal ICLK<4> occurs, the first to third latch commands LC<1:3> and the fifth to eighth latch commands LC<5:8> may be generated to have a logic "low (L)" level and the fourth latch command LC<4> may be generated to have a logic "high (H)" level. In such a case, the first input information signal MS may be generated to have a logic "low (L)" level and both of the second and third input information signals NS and LS may be generated to have a logic "high (H)" level, according to a combination of the first to eighth latch commands LC<1:8>.

If the command CMD is inputted at a point of time that a pulse of the fifth division clock signal ICLK<5> occurs, the first to fourth latch commands LC<1:4> and the sixth to eighth latch commands LC<6:8> may be generated to have a logic "low (L)" level and the fifth latch command LC<5> may be generated to have a logic "high (H)" level. In such a case, the first input information signal MS may be generated to have a logic "high (H)" level and both of the second and third input information signals NS and LS may be generated to have a logic "low (L)" level, according to a combination of the first to eighth latch commands LC<1:8>.

If the command CMD is inputted at a point of time that a pulse of the sixth division clock signal ICLK<6> occurs, the first to fifth latch commands LC<1:5> and the seventh and eighth latch commands LC<7:8> may be generated to have a logic "low (L)" level and the sixth latch command LC<6> may be generated to have a logic "high (H)" level. In such a case, both of the first and third input information signals MS and LS may be generated to have a logic "high (H)" level and the second input information signal NS may be generated to have a logic "low (L)" level, according to a combination of the first to eighth latch commands LC<1:8>.

If the command CMD is inputted at a point of time that a pulse of the seventh division clock signal ICLK<7> occurs, the first to sixth latch commands LC<1:6> and the eighth latch command LC<8> may be generated to have a logic "low (L)" level and the seventh latch command LC<7> may be generated to have a logic "high (H)" level. In such a case, both of the first and second input information signals MS and NS may be generated to have a logic "high (H)" level and the third input information signal LS may be generated to have a logic "low (L)" level, according to a combination of the first to eighth latch commands LC<1:8>.

If the command CMD is inputted at a point of time that a pulse of the eighth division clock signal ICLK<8> occurs, the first to seventh latch commands LC<1:7> may be generated to have a logic "low (L)" level and the eighth latch command LC<8> may be generated to have a logic "high (H)" level. In such a case, all of the first to third input information signals MS, NS and LS may be generated to have a logic "high (H)" level according to a combination of the first to eighth latch commands LC<1:8>.

Figure 14:
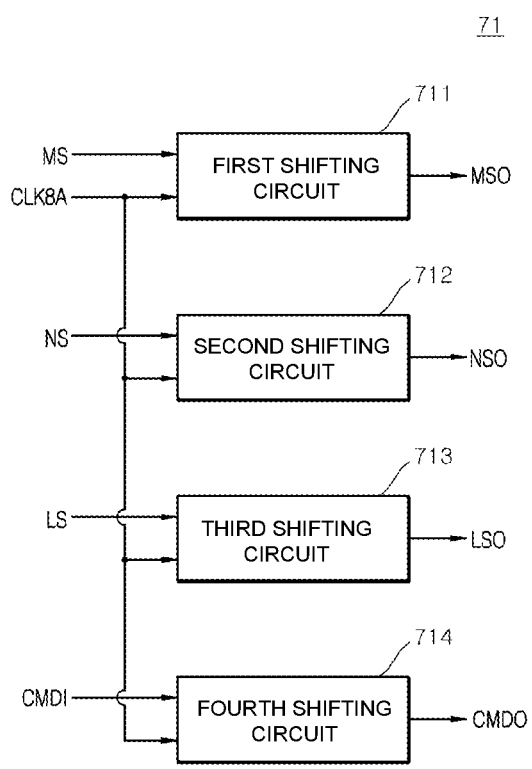
FIG. 14 is a block diagram illustrating a configuration of a shifting circuit included in the semiconductor device of FIG. 10.

Referring to FIG. 14, the shifting circuit 71 may include a first shifting circuit 711, a second shifting circuit 712, a third shifting circuit 713 and a fourth shifting circuit 714.

The first shifting circuit 711 may shift a phase of the first input information signal MS to generate the first control signal MSO, in synchronization with the first multiplication clock signal CLK8A. The first shifting circuit 711 may be realized using a plurality of registers and may delay the first input information signal MS according to a frequency of the first multiplication clock signal CLK8A to generate the first control signal MSO.

The second shifting circuit 712 may shift a phase of the second input information signal NS to generate the second control signal NSO, in synchronization with the first multiplication clock signal CLK8A. The second shifting circuit 712 may be realized using a plurality of registers and may delay the second input information signal NS according to a frequency of the first multiplication clock signal CLK8A to generate the second control signal NSO.

The third shifting circuit 713 may shift a phase of the third input information signal LS to generate the third control signal LSO, in synchronization with the first multiplication clock signal CLK8A. The third shifting circuit 713 may be realized using a plurality of registers and may delay the third input information signal LS according to a frequency of the first multiplication clock signal CLK8A to generate the third control signal LSO.

The fourth shifting circuit 714 may shift a phase of the input command CMDI to generate the shifted command CMDO, in synchronization with the first multiplication clock signal CLK8A. The fourth shifting circuit 714 may be realized using a plurality of registers and may delay the input command CMDI according to a frequency of the first multiplication clock signal CLK8A to generate the shifted command CMDO.

The first to fourth shifting circuits 711, 712, 713 and 714 may be designed to have the same delay time. The delay time of the first to fourth shifting circuits 711, 712, 713 and 714 may be set to be different according to a latency of the semiconductor device.

Figure 15:
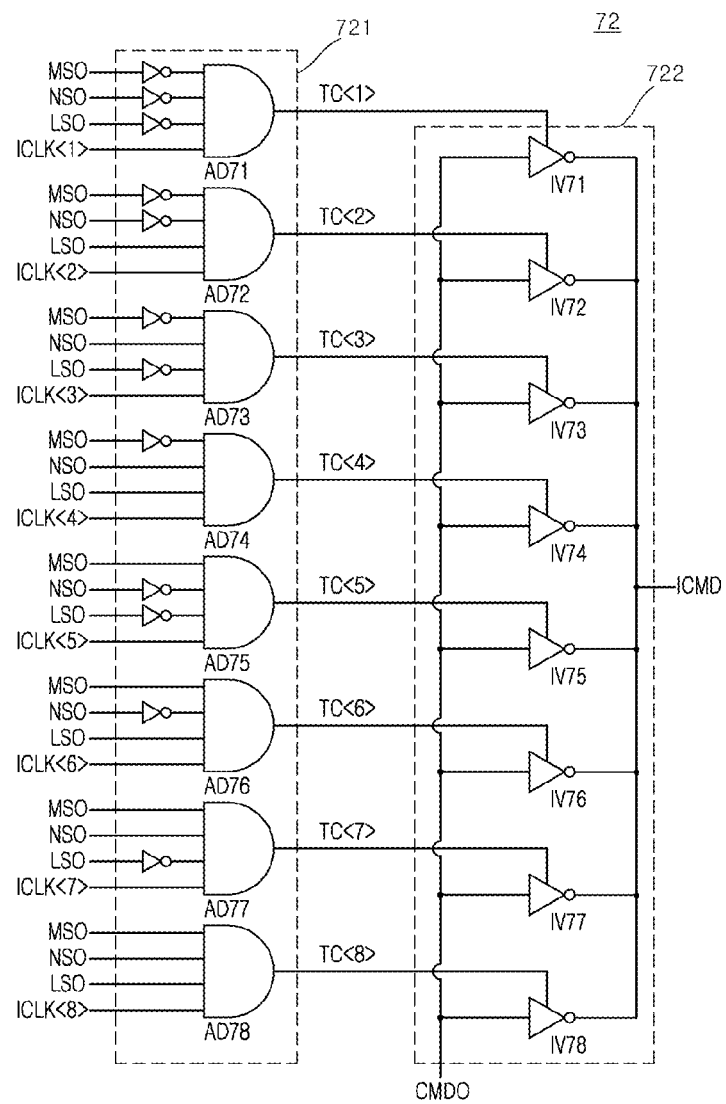
FIG. 15 is a circuit diagram illustrating an internal command generation circuit included in the semiconductor device of FIG. 10.

Referring to FIG. 15, the internal command generation circuit 72 may include a transmission command generation circuit 721 and an internal command output circuit 722.

The transmission command generation circuit 721 may include, for example but not limited to, logic gates for performing AND operations. For example, the transmission command generation circuit 321 may include for example but not limited to AND gates AD71, AD72, AD73, AD74, AD75, AD76, AD77 and AD78.

The AND gate AD71 may generate a first transmission command TC<1> which is enabled if the first to third control signals MSO, NSO and LSO have a predetermined combination in synchronization with the first division clock signal ICLK<1>. The AND gate AD71 may generate the first transmission command TC<1> which is enabled to have a logic "high" level at a point of time that a pulse of the first division clock signal ICLK<1> is inputted if all of the first to third control signals MSO, NSO and LSO have a logic "low" level.

The AND gate AD72 may generate a second transmission command TC<2> which is enabled if the first to third control signals MSO, NSO and LSO have a predetermined combination in synchronization with the second division clock signal ICLK<2>. The AND gate AD72 may generate the second transmission command TC<2> which is enabled to have a logic "high" level at a point of time that a pulse of the second division clock signal ICLK<2> is inputted if the first and second control signals MSO and NSO have a logic "low" level and the third control signal LSO has a logic "high" level.

The AND gate AD73 may generate a third transmission command TC<3> which is enabled if the first to third control signals MSO, NSO and LSO have a predetermined combination in synchronization with the third division clock signal ICLK<3>. The AND gate AD73 may generate the third transmission command TC<3> which is enabled to have a logic "high" level at a point of time that a pulse of the third division clock signal ICLK<3> is inputted if the first and third control signals MSO and LSO have a logic "low" level and the second signal NSO has a logic "high" level.

The AND gate AD74 may generate a fourth transmission command TC<4> which is enabled if the first to third control signals MSO, NSO and LSO have a predetermined combination in synchronization with the fourth division clock signal ICLK<4>. The AND gate AD74 may generate the fourth transmission command TC<4> which is enabled to have a logic "high" level at a point of time that a pulse of the fourth division clock signal ICLK<4> is inputted if the first control signal MSO has a logic "low" level and both of the second and third control signals NSO and LSO have a logic "high" level.

The AND gate AD75 may generate a fifth transmission command TC<5> which is enabled if the first to third control signals MSO, NSO and LSO have a predetermined combination in synchronization with the fifth division clock signal ICLK<5>. The AND gate AD75 may generate the fifth transmission command TC<5> which is enabled to have a logic "high" level at a point of time that a pulse of the fifth division clock signal ICLK<5> is inputted if the first control signal MSO has a logic "high" level and both of the second and third control signals NSO and LSO have a logic "low" level.

The AND gate AD76 may generate a sixth transmission command TC<6> which is enabled if the first to third control signals MSO, NSO and LSO have a predetermined combination in synchronization with the sixth division clock signal ICLK<6>. The AND gate AD76 may generate the sixth transmission command TC<6> which is enabled to have a logic "high" level at a point of time that a pulse of the sixth division clock signal ICLK<6> is inputted if both of the first and third control signals MSO and LSO have a logic "high" level and the second control signal NSO has logic "low" level.

The AND gate AD77 may generate a seventh transmission command TC<7> which is enabled if the first to third control signals MSO, NSO and LSO have a predetermined combination in synchronization with the seventh division clock signal ICLK<7>. The AND gate AD77 may generate the seventh transmission command TC<7> which is enabled to have a logic "high" level at a point of time that a pulse of the seventh division clock signal ICLK<7> is inputted if both of the first and second control signals MSO and NSO have a logic "high" level and the third control signal LSO has logic "low" level.

The AND gate AD78 may generate an eighth transmission command TC<8> which is enabled if the first to third control signals MSO, NSO and LSO have a predetermined combination in synchronization with the eighth division clock signal ICLK<8>. The AND gate AD78 may generate the eighth transmission command TC<8> which is enabled to have a logic "high" level at a point of time that a pulse of the eighth division clock signal ICLK<8> is inputted if all of the first to third control signals MSO, NSO and LSO have a logic "high" level.

The internal command output circuit 722 may include inverters IV71, IV72, IV73, IV74, IV75, IV76, IV77 and IV78.

The inverter IV71 may inversely buffer the shifted command CMDO to output the inversely buffered signal as the internal command ICMD, in response to the first transmission command TC<1>. The inverter IV71 may inversely buffer the shifted command CMDO to output the inversely buffered signal as the internal command ICMD if the first transmission command TC<1> is enabled to have a logic "high" level.

The inverter IV72 may inversely buffer the shifted command CMDO to output the inversely buffered signal as the internal command ICMD, in response to the second transmission command TC<2>. The inverter IV72 may inversely buffer the shifted command CMDO to output the inversely buffered signal as the internal command ICMD if the second transmission command TC<2> is enabled to have a logic "high" level.

The inverter IV73 may inversely buffer the shifted command CMDO to output the inversely buffered signal as the internal command ICMD, in response to the third transmission command TC<3>. The inverter IV73 may inversely buffer the shifted command CMDO to output the inversely buffered signal as the internal command ICMD if the third transmission command TC<3> is enabled to have a logic "high" level.

The inverter IV74 may inversely buffer the shifted command CMDO to output the inversely buffered signal as the internal command ICMD, in response to the fourth transmission command TC<4>. The inverter IV74 may inversely buffer the shifted command CMDO to output the inversely buffered signal as the internal command ICMD if the fourth transmission command TC<4> is enabled to have a logic "high" level.

The inverter IV75 may inversely buffer the shifted command CMDO to output the inversely buffered signal as the internal command ICMD, in response to the fifth transmission command TC<5>. The inverter IV75 may inversely buffer the shifted command CMDO to output the inversely buffered signal as the internal command ICMD if the fifth transmission command TC<5> is enabled to have a logic "high" level.

The inverter IV76 may inversely buffer the shifted command CMDO to output the inversely buffered signal as the internal command ICMD, in response to the sixth transmission command TC<6>. The inverter IV76 may inversely buffer the shifted command CMDO to output the inversely buffered signal as the internal command ICMD if the sixth transmission command TC<6> is enabled to have a logic "high" level.

The inverter IV77 may inversely buffer the shifted command CMDO to output the inversely buffered signal as the internal command ICMD, in response to the seventh transmission command TC<7>. The inverter IV77 may inversely buffer the shifted command CMDO to output the inversely buffered signal as the internal command ICMD if the seventh transmission command TC<7> is enabled to have a logic "high" level.

The inverter IV78 may inversely buffer the shifted command CMDO to output the inversely buffered signal as the internal command ICMD, in response to the eighth transmission command TC<8>. The inverter IV78 may inversely buffer the shifted command CMDO to output the inversely buffered signal as the internal command ICMD if the eighth transmission command TC<8> is enabled to have a logic "high" level.

As described above, a semiconductor device according to an embodiment may latch a command in synchronization with a point of time that a division clock signal is inputted and may shift a phase of the latched command in synchronization with a multiplication clock signal to reduce the number of registers for shifting the command.

Figure 16:
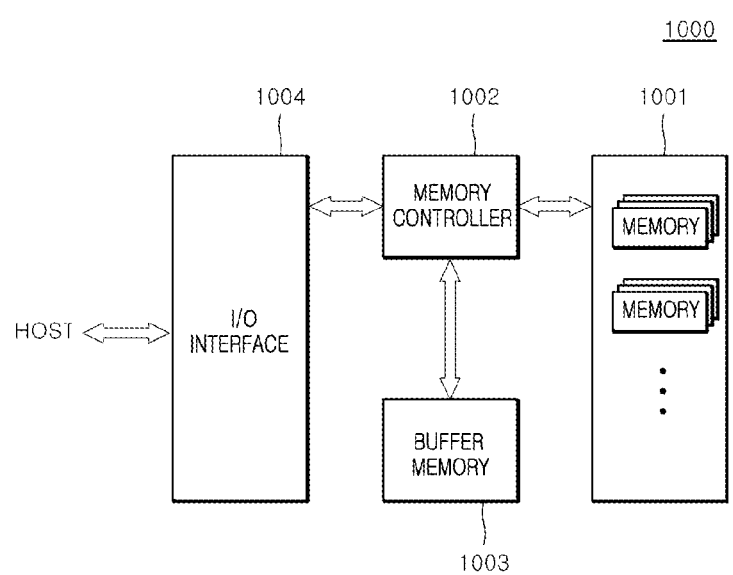
FIG. 16 is a block diagram illustrating a configuration of an electronic system employing at least one of the semiconductor devices described with reference to FIGS. 1 to 15.

At least one of the semiconductor devices described with reference to FIGS. 1 to 15 may be applied to an electronic system that includes a memory system, a graphic system, a computing system, a mobile system, or the like. For example, as illustrated in FIG. 16, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include at least one of the semiconductor devices illustrated in FIGS. 1 and 15. The data storage circuit 1001 may generate internal data having logic levels which are internally set regardless of external data and may execute an initialization operation for storing the internal data into a memory cell array. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 16 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
an input information signal generation circuit configured to generate an input information signal having a combination according to a point of time that a command is inputted in synchronization with a division clock signal and configured to generate an input command which is enabled if the input information signal is generated; and
a command generation circuit configured to shift a phase of the input command in synchronization with a multiplication clock signal to generate a shifted command and configured to output the shifted command as an internal command in synchronization with the division clock signal,
wherein a point of time that the internal command is outputted from the command generation circuit is controlled according to the combination of the input information signal.

2. The semiconductor device of claim 1, wherein the input information signal includes information on a point of time that the command is inputted.

3. The semiconductor device of claim 1, wherein the division clock signal is generated by dividing a frequency of a clock signal which is provided externally from the semiconductor device.

4. The semiconductor device of claim 3, wherein the multiplication clock signal has a frequency which is one $(4N)^{th}$ a frequency of the clock signal (where, "N" is a natural number).

5. The semiconductor device of claim 1, further comprising a frequency division circuit configured to generate the division clock signal by dividing a frequency of a clock signal,
wherein the division clock signal includes first to fourth division clock signals, and
wherein a phase difference between the first to fourth division clock signals is 90 degrees.

6. The semiconductor device of claim 1,
wherein the division clock signal includes first to fourth division clock signals;
wherein the input information signal includes a first input information signal and a second input information signal; and
wherein the input information signal generation circuit includes:
a latch circuit configured to latch the command at generation moments of pulses of the first to fourth division clock signals to generate first to fourth latch commands, one of which is selectively enabled; and
an encoder configured to generate the first and second input information signals and the input command according to a combination of the first to fourth latch commands.

7. The semiconductor device of claim 6, wherein the latch circuit includes:
a first latch configured to latch the command in synchronization with the first division clock signal and configured to output the latched command as the first latch command based on an output control signal;
a second latch configured to latch the command in synchronization with the second division clock signal and configured to output the latched command as the second latch command based on the output control signal;
a third latch configured to latch the command in synchronization with the third division clock signal and configured to output the latched command as the third latch command based on the output control signal; and
a fourth latch configured to latch the command in synchronization with the fourth division clock signal and configured to output the latched command as the fourth latch command based on the output control signal.

8. The semiconductor device of claim 6, wherein the first to fourth division clock signals are sequentially generated.

9. The semiconductor device of claim 6,
wherein the multiplication clock signal includes first to fourth multiplication clock signals,
wherein the first to fourth division clock signals are sequentially generated in synchronization with the first to fourth multiplication clock signals,
wherein the first division clock signal includes a pulse occurring in synchronization with a rising edge of the first multiplication clock signal,
wherein the second division clock signal includes a pulse occurring in synchronization with a rising edge of the second multiplication clock signal,
wherein the third division clock signal includes a pulse occurring in synchronization with a rising edge of the third multiplication clock signal, and wherein the fourth division clock signal includes a pulse occurring in synchronization with a rising edge of the fourth multiplication clock signal.

10. The semiconductor device of claim 6, wherein the encoder includes:
a first logic circuit configured to generate the first input information signal which is enabled if any one of the third and fourth latch commands is enabled and configured to generate the second input information signal which is enabled if any one of the second latch command and the fourth latch command is enabled; and
a second logic circuit configured to generate the input command which is enabled if any one of the first to fourth latch commands is enabled.

11. The semiconductor device of claim 10,
wherein the first logic circuit includes a first OR gate configured to receive the third and fourth latch commands and output the first input information signal,
wherein the first logic circuit includes a second OR gate configured to receive the second and fourth latch commands and output the second input information signal, and
wherein the second logic circuit includes a third OR gate configured to receive the first to fourth latch commands and output the input command.

12. The semiconductor device of claim 6, wherein the encoder includes:
a logic circuit configured to generate the input command which is enabled if any one of the first to fourth latch commands is enabled;
a first transmission circuit configured to generate the first input information signal which is enabled if any one of the third and fourth latch commands is enabled in response to the input command; and
a second transmission circuit configured to generate the second input information signal which is enabled if any one of the second and fourth latch commands is enabled in response to the input command.

13. The semiconductor device of claim 1,
wherein the division clock signal includes first to fourth division clock signals;
wherein the input information signal includes a first input information signal and a second input information signal; and
wherein the command generation circuit includes:
a shifting circuit configured to shift phases of the first and second input information signals to generate a first control signal and a second control signal in synchronization with the multiplication clock signal and configured to shift a phase of the input command to generate the shifted command in synchronization with the multiplication clock signal; and
an internal command generation circuit configured to output the shifted command as the internal command according to a combination of the first and second control signals, in synchronization with the first to fourth division clock signals.

14. The semiconductor device of claim 13, wherein the shifting circuit includes:
a first shifting circuit configured to shift a phase of the first input information signal to generate the first control signal in synchronization with the multiplication clock signal;
a second shifting circuit configured to shift a phase of the second input information signal to generate the second control signal in synchronization with the multiplication clock signal; and
a third shifting circuit configured to shift a phase of the input command to generate the shifted command in synchronization with the multiplication clock signal.

15. The semiconductor device of claim 14, wherein the first to third shifting circuits have substantially the same delay time.

16. The semiconductor device of claim 13, wherein the internal command generation circuit includes:
a transmission command generation circuit configured to generate first to fourth transmission commands, one of which is selectively enabled, according to a combination of the first and second control signals in synchronization with the first to fourth division clock signals; and
an internal command output circuit configured to output the shifted command as the internal command in response to the first to fourth transmission commands.

17. A semiconductor device comprising:
an input information signal generation circuit configured to generate an input information signal having a combination according to a point of time that a command is inputted in synchronization with a division clock signal and configured to generate an input command which is enabled if the input information signal is generated;
a shifting circuit configured to shift a phase of the input information signal to generate a control signal in synchronization with a multiplication clock signal and configured to shift a phase of the input command to generate a shifted command in synchronization with the multiplication clock signal; and
an internal command generation circuit configured to output the shifted command as an internal command according to the combination of the control signal in synchronization with the division clock signal.

18. The semiconductor device of claim 17, wherein the input information signal includes information on a point of time that the command is inputted.

19. The semiconductor device of claim 17, further comprising a frequency division circuit configured to divide a frequency of a clock signal to generate the division clock signal and the multiplication clock signal,
wherein the multiplication clock signal is generated to have a frequency which is one $(4N)^{th}$ a frequency of the clock signal (where, "N" is a natural number).

20. The semiconductor device of claim 17, further comprising a frequency division circuit configured to generate the division clock signal by dividing a frequency of a clock signal,
wherein the division clock signal includes first to fourth division clock signals, and
wherein a phase difference between the first to fourth division clock signals is 90 degrees.

21. The semiconductor device of claim 19,
wherein the division clock signal includes first to fourth division clock signals;
wherein the multiplication clock signal includes first to fourth multiplication clock signals; and
wherein the frequency division circuit includes:
a multiplication clock generation circuit configured to generate the first to fourth multiplication clock signals having a frequency which is one $(4N)^{th}$ a frequency of the clock signal in response to the clock signal; and
a division clock generation circuit configured to generate the first to fourth division clock signals which are sequentially created in synchronization with the first to fourth multiplication clock signals.

22. The semiconductor device of claim 17,
wherein the division clock signal includes first to fourth division clock signals;
wherein the input information signal includes a first input information signal and a second input information signal; and
wherein the input information signal generation circuit includes:
a latch circuit configured to latch the command at generation moments of pulses of the first to fourth division clock signals to generate first to fourth latch commands, one of which is selectively enabled; and
an encoder configured to generate the first and second input information signals and the input command according to a combination of the first to fourth latch commands.

23. The semiconductor device of claim 22, wherein the latch circuit includes:
a first latch configured to latch the command in synchronization with the first division clock signal and configured to output the latched command as the first latch command based on an output control signal;
a second latch configured to latch the command in synchronization with the second division clock signal and configured to output the latched command as the second latch command based on the output control signal;
a third latch configured to latch the command in synchronization with the third division clock signal and configured to output the latched command as the third latch command based on the output control signal; and
a fourth latch configured to latch the command in synchronization with the fourth division clock signal and configured to output the latched command as the fourth latch command based on the output control signal.

24. The semiconductor device of claim 22,
wherein the multiplication clock signal includes first to fourth multiplication clock signals,
wherein the first to fourth division clock signals are sequentially generated in synchronization with the first to fourth multiplication clock signals,
wherein the first division clock signal includes a pulse occurring in synchronization with a rising edge of the first multiplication clock signal,
wherein the second division clock signal includes a pulse occurring in synchronization with a rising edge of the second multiplication clock signal,
wherein the third division clock signal includes a pulse occurring in synchronization with a rising edge of the third multiplication clock signal, and
wherein the fourth division clock signal includes a pulse occurring in synchronization with a rising edge of the fourth multiplication clock signal.

25. The semiconductor device of claim 22, wherein the encoder includes:
a first logic circuit configured to generate the first input information signal which is enabled if any one of the third and fourth latch commands is enabled and configured to generate the second input information signal which is enabled if any one of the second latch command and the fourth latch command is enabled; and
a second logic circuit configured to generate the input command which is enabled if any one of the first to fourth latch commands is enabled.

26. The semiconductor device of claim 25,
wherein the first logic circuit includes a first OR gate configured to receive the third and fourth latch commands and output the first input information signal,
wherein the first logic circuit includes a second OR gate configured to receive the second and fourth latch commands and output the second input information signal, and
wherein the second logic circuit includes a third OR gate configured to receive the first to fourth latch commands and output the input command.

27. The semiconductor device of claim 22, wherein the encoder includes:
a logic circuit configured to generate the input command which is enabled if any one of the first to fourth latch commands is enabled;
a first transmission circuit configured to generate the first input information signal which is enabled if any one of the third and fourth latch commands is enabled in response to the input command; and
a second transmission circuit configured to generate the second input information signal which is enabled if any one of the second and fourth latch commands is enabled in response to the input command.

28. The semiconductor device of claim 17,
wherein the input information signal includes a first input information signal and a second input information signal;
wherein the control signal includes a first control signal and a second control signal; and
wherein the shifting circuit includes:
a first shifting circuit configured to shift a phase of the first input information signal to generate the first control signal in synchronization with the multiplication clock signal;
a second shifting circuit configured to shift a phase of the second input information signal to generate the second control signal in synchronization with the multiplication clock signal; and
a third shifting circuit configured to shift a phase of the input command to generate the shifted command in synchronization with the multiplication clock signal.

29. The semiconductor device of claim 28, wherein the first to third shifting circuits have substantially the same delay time.

30. The semiconductor device of claim 17,
wherein the division clock signal includes first to fourth division clock signals;
wherein the control signal includes a first control signal and a second control signal; and
wherein the internal command generation circuit includes:
a transmission command generation circuit configured to generate first to fourth transmission commands, one of which is selectively enabled, according to a combination of the first and second control signals in synchronization with the first to fourth division clock signals; and
an internal command output circuit configured to output the shifted command as the internal command in response to the first to fourth transmission commands.

31. A semiconductor device comprising:
an input information signal generation circuit configured to latch a command in synchronization with a point of time that a division clock signal is inputted; and
a command generation circuit configured to shift a phase of the latched command of the input information signal generation circuit, in synchronization with a multiplication clock signal, which is different from the divisional clock signal, to shift the command.

* * * * *